United States Patent [19]

Sallée et al.

[11] Patent Number: 4,817,436

[45] Date of Patent: Apr. 4, 1989

[54] MEASURING DEVICE FORMING FLUXMETER AND TEMPERATURE SENSOR COMBINED AND PROCESS FOR PREPARING THE SAME

[75] Inventors: Hébert Sallée, Saint Martin d'Heres; Daniel Quenard, Gieres, both of France

[73] Assignee: Centre Scientifique et Technique du Batiment, Paris, France

[21] Appl. No.: 116,378

[22] Filed: Nov. 3, 1987

[30] Foreign Application Priority Data

Nov. 5, 1986 [FR] France ................................ 86 15427

[51] Int. Cl.$^4$ .................. G01L 19/04; B44C 1/22; C23F 1/02; H01L 21/306
[52] U.S. Cl. .......................................... 73/708; 73/766; 136/225; 156/634; 156/637; 156/644; 156/656; 156/661.1; 156/902
[58] Field of Search ............... 29/612, 852; 73/708, 73/766; 374/29, 30, 100; 338/3, 22 R, 22 RD, 25; 156/630, 634, 637, 639, 644, 652, 656, 659.1, 661.1, 662, 901, 902; 136/225

[56] References Cited

U.S. PATENT DOCUMENTS

| 3,554,815 | 1/1971 | Osborn ............................. 136/203 |
| 4,050,302 | 9/1977 | Haupin .............................. 73/190 |
| 4,197,738 | 4/1980 | Degenne ............................ 73/190 |
| 4,349,958 | 9/1982 | Hakansson et al. ................ 29/612 |
| 4,507,854 | 4/1985 | Hansson et al. ................... 29/612 |
| 4,625,389 | 12/1986 | Readhead .......................... 437/3 |

FOREIGN PATENT DOCUMENTS

| 2536536 | 5/1984 | France . |
| 5684987 | 3/1983 | Japan . |
| 56108877 | 4/1983 | Japan . |
| 58117057 | 5/1985 | Japan . |

OTHER PUBLICATIONS

"Les Capteurs Pelliculaires et Leurs Applications", Michel Portat, et al. Nov. 1981, 806 Mesures Regulation Automatisme vol. 46 (1981) Nov. No. 11, Paris, France.

*Primary Examiner*—William A. Powell
*Attorney, Agent, or Firm*—Weingarten, Schurgin, Gagnebin & Hayes

[57] ABSTRACT

The invention relates to a composite material, which comprises a sheet of insulating matter comprising on one face a meandering strip of Constantan covered with zones of copper, so as to define a fluxmeter formed by successive rows of individual thermocouples. Between the rows defined between the meanders of the strip are provided free spaces in which are made first patterns likewise of Constantan constituting a first arm of a thermocouple; the other face of the insulating sheet is coated with a sheet of copper in which are provided second patterns likewise of copper constituting a second arm of thermocouples. The first patterns and the second patterns are in electrical contact by metal welds also of copper, thus forming temperature detector thermocouples. A composite material is thus obtained forming a fluxmeter and a temperature sensor combined in a single device making it possible to detect the measurements in one plane, which is easy to manufacture.

19 Claims, 3 Drawing Sheets

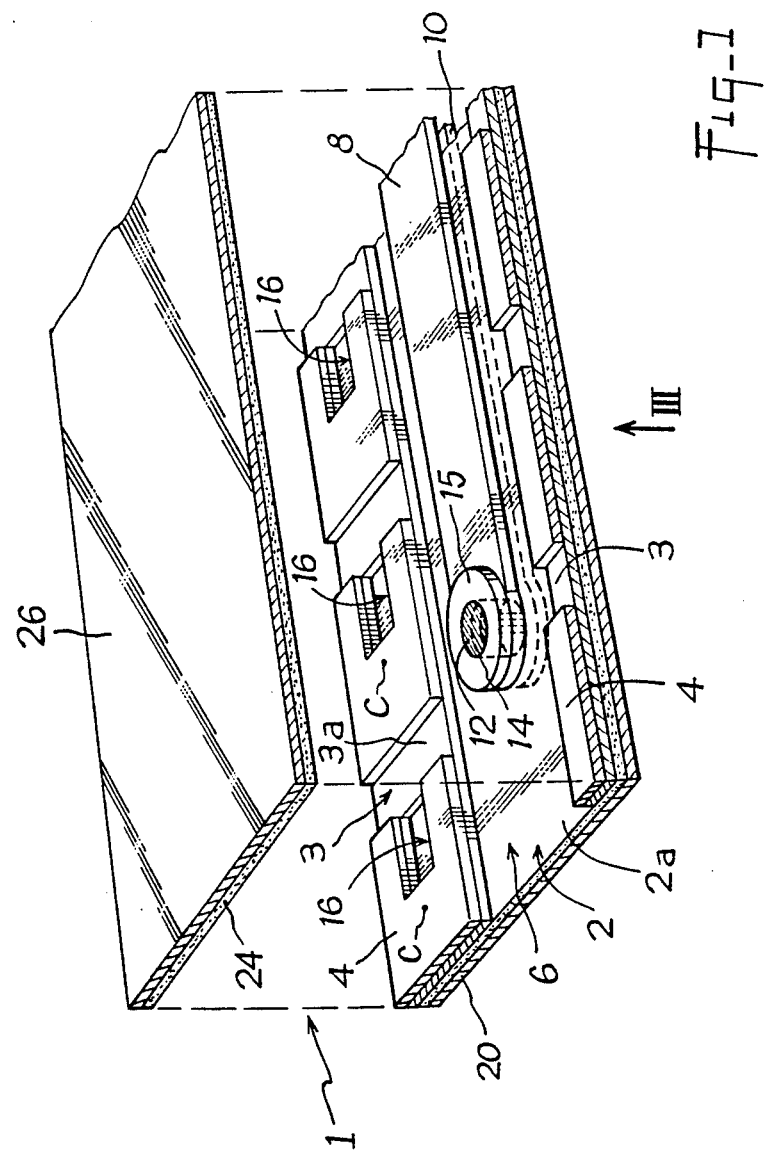

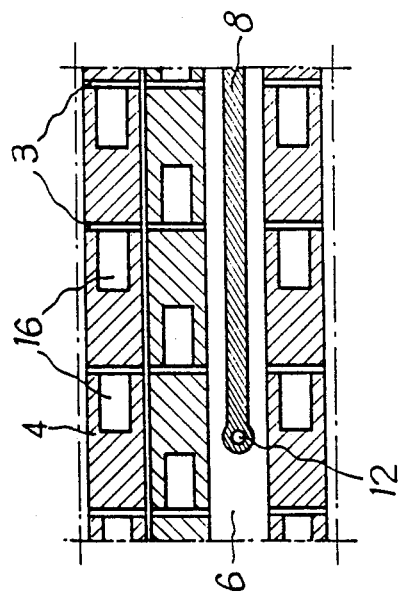
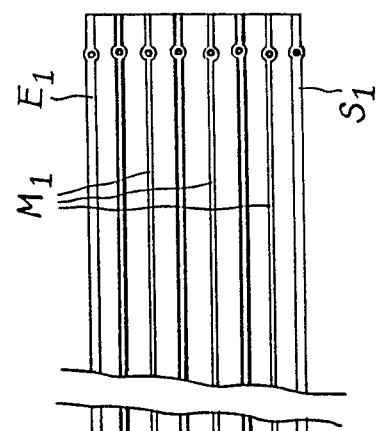
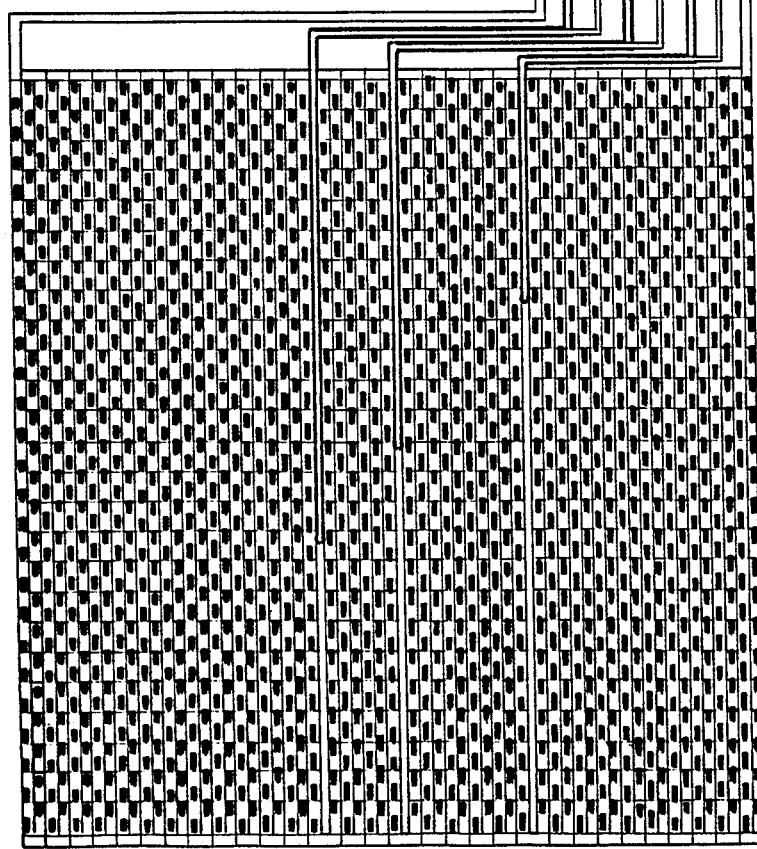

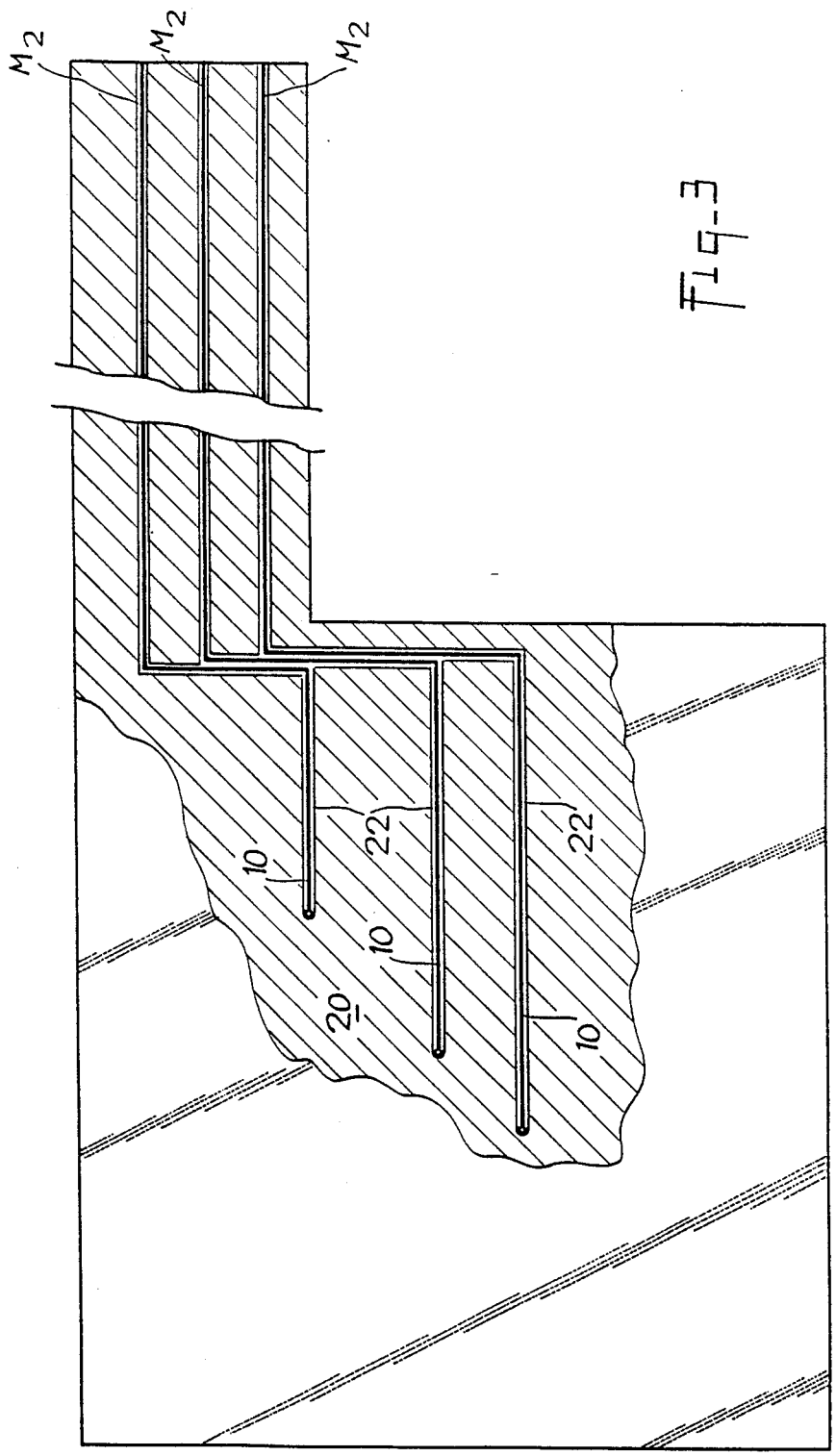

MEASURING DEVICE FORMING FLUXMETER AND TEMPERATURE SENSOR COMBINED AND PROCESS FOR PREPARING THE SAME

FIELD OF THE INVENTION

The present invention essentially relates to a novel composite material, preferably flexible, to a measuring device forming a fluxmeter and a temperature sensor combined, comprising such a composite material, and to a process for preparing such a material.

BACKGROUND OF THE INVENTION

French Pat. No. 2 536 536 discloses a composite material, preferably flexible, comprising a substrate of insulating matter 1, on one face of which is deposited an uninterrupted thin layer 2 of a first conductive or semi-conductive matter coated on at least its face opposite said substrate of insulating matter by a succession of zones 3, separated from one another, and disposed in successive rows, constituted by very thin deposits of a second conductive or semi-conductive matter having a different thermoelectric power from that of the first conductive or semi-conductive matter. According to a preferred feature described in this document, at least one channel 4 passes right through each zone 3 and the subjacent thin layer 2, these channels being offset with respect to the centre of each zone traversed advantageously in the same direction, said channels being able to be internally coated with a deposit 7 of the second matter. According to another preferred feature, the uninterrupted layer has the form of an advantageously meandering strip in order to be bendable to form a rectangular or square structure (cf. claims 3 and 4).

In this way, several hundred of elementary thermocouples are obtained, this composite material then constituting a thermic fluxmeter. According to another variant, object of FIGS. 5 and 6, the zones composed of the second matter may be made on each of the faces of the uninterrupted thin layer 2.

The process for preparing such a composite material is described more particularly on page 6, lines 5 to 33 and includes the gluing of a sheet of Constantan on a support formed by a plate 1 of plastics material, followed by the attack by the conventional technique of engraving used for manufacturing printed circuits, of the sheet of Constantan along parallel lines 6 forming two imbricated combs so as to define an uninterrupted thin layer in the form of a meandering strip 2a. On this meandering strip 2a there is deposited by electrolysis layers 3a of copper some microns thick after having protected, by means of a layer of photosensitive resin, the portions which are not to be copper-plated, so as to define the zones 3 mentioned above. One then proceeds with an engraving of holes 4a by chemical attack, these holes then being internally coated with a layer 7 composed of the second conductive or semi-conductive matter, particularly copper.

Finally, the upper face of the device may be coated with a layer 5 of thermosetting resin protecting the copper and the Constantan from oxidation.

Japanese Pat. No. 58 10875 to TOSHIBA further discloses a process for manufacturing sheet-shaped thermocouples. The structure of these thermocouples comprises a support film made of heat-resistant resin, for example a film of polyimide resin, of which one surface is coated with a layer of copper, whilst the opposite surface is coated with a layer of Constantan, the two metal layers then being subjected to etching so as to leave the conducting wire part.

Through holes are then made through the end parts of the two conductor parts and copper is plated on the inside of the orifice, so as to connect the conductor wire parts comprising copper and Constantan.

U.S. Pat. No. 3,554,815 to DU PONT DE NEMOURS also describes a thermopile based on the combination of individual thermocouples disposed on either side of a heat-resistant insulating substrate and connected together by through orifices 11 which are then filled with solder. The shape of the thermocouples is obtained by plating procedures and photoengraving techniques.

The thermocouples are mounted in series. As support material, mention is made of plates of glass-fiber reinforced epoxy resin, laminates of such plates, plates of glass-fiber reinforced, unsaturated polyester resin, laminates of such plates, a laminated plate of phenolic resin-paper and the like.

It is thus observed that, in accordance with the heretofore known devices, they are either constituted by composite materials forming fluxmeter, or by composite materials including one or more thermocouples forming temperature detecting devices.

Where it is desired to measure the thermal flux and to measure the temperature, which is usually necessary, distinct devices should be used, which are therefore inserted at different places, which may lead to corrections of measurement.

It is therefore an object of the present invention to solve the new technical problem of providing a composite material made so as to constitute a measuring device forming a fluxmeter and a temperature sensor combined, with the result that the insertion of a single device enables the thermal flux and the temperature to be measured.

It is also an object of the present invention to solve the new technical problem of providing a composite material made so as to allow the detection of the thermal flux and of the temperature in the same plane.

These technical problems are satisfactorily solved for the first time by the present invention.

SUMMARY OF THE INVENTION

According to a first aspect, the present invention provides a composite material, preferably flexible, comprising a substrate of insulating matter on one face of which is deposited an uninterrupted thin layer of a first conductive or semiconductive matter coated on at least its face opposite said substrate of insulating matter by a succession of zones, separated from one another and disposed in successive rows, constituted by very thin deposits of a second conductive or semi-conductive matter having a different thermoelectric power from that of the first conductive or semi-conductive matter, characterized in that said insulating substrate comprises on its face comprising said uninterrupted thin layer a certain number of free spaces in at least certain of which are made a certain number of first metal patterns of a third conductive or semi-conductive matter, constituting a first arm of a thermocouple, an equal number of second metal patterns of a fourth conductive or semi-conductive matter with a thermoelectric power different from said third matter, constituting a second arm of a thermocouple, is disposed on that face of the insulating substrate opposite said thin layer and said first pattern, each first pattern is in contact with a corresponding second pattern by a metallic spot weld made in an orifice passing through said pattern and said substrate of insulating matter.

According to an advantageous embodiment, welding is effected by metallization and covers said first pattern over a determined surface around the orifice, thus forming a metal layer for mechanical connection of said weld.

According to a preferred embodiment, the third conductive or semi-conductive matter constituting the first patterns and the first conductive or semi-conductive matter constituting the uninterrupted thin layer mentioned above are made of the same conductive or semi-conductive matter. According to another preferred embodiment, the metal welding is made of the same conductive or semi-conductive matter constituting the zones mentioned above. According to a particular embodiment, at least one channel passes right through at least the majority of the said zones and the subjacent thin layer, these channels being offset with respect to the centre of each zone traversed.

According to a particular feature, the channels are offset with respect to one another on either side of the centre of each zone traversed between two successive or adjacent rows. According to yet another feature of the invention, the composite material comprises a thin sheet of a fifth conductive or semi-conductive matter applied against the other face of the insulating substrate opposite the face comprising the uninterrupted thin layer with the said zones, comprising spaces for the second patterns mentioned above. These second patterns are preferably made of the same conductive or semi-conductive matter as the sheet. According to a particular advantageous embodiment, the uninterrupted thin layer and the first patterns are made of Constantan, whilst the sheet and the second patterns are made of copper. According to another particular feature, this composite material further comprises a sheet of insulating matter applied against the zones mentioned above, this sheet of insulating matter preferably being coated with a sheet of a sixth conductive or semi-conductive matter on its face opposite the said zones, this sixth conductive or semi-conductive matter advantageously being identical to the fifth conductive or semi-conductive matter, therefore preferably copper.

According to another particular feature, the uninterrupted thin layer is in the form of an advantageously meandering strip and thus defines the successive rows mentioned above. It will be readily understood that all the technical advantages set forth hereinbefore are unexpectedly obtained, namely the combination of a fluxmeter and of a temperature sensor. In addition, this fluxmeter and this temperature sensor being made of the same composite material, the measurements are made in the same plane, which leads to an exceptionally precise measurement. In addition, by the presence of the sheets of fifth conductive or semi-conductive matter and of sixth conductive or semi-conductive matter electrically insulated from the uninterrupted thin layer defining the thermal fluxmeter, the flux is uniformly distributed and, especially, one of these sheets for uniformly distributing the flux is constituted by the one which comprises the second patterns mentioned above and which constitutes an integral part of the temperature sensor. In this way, a totally unexpected radical simplification of the design of the combined fluxmeter and sensor is thus obtained, itself leading to an unexpected, non-obvious simplification of the process of manufacturing such a composite material constituting a measuring device forming fluxmeter and temperature sensor combined.

According to a second aspect, the present invention relates to a measuring device forming a fluxmeter and a temperature sensor combined, characterized in that it comprises a composite material as defined hereinabove, in which the ends of the said uninterrupted thin layer are connected together via an apparatus forming fluxmeter and measuring the electromotive force as a function of the thermal flux passing through the composite material, whilst the first patterns are connected to the second patterns by an apparatus forming temperature detector and measuring the electromotive force as a function of the temperature.

Finally, according to a third aspect, the present invention provides a process for preparing the composite material mentioned hereinabove, advantageously used as measuring device forming a fluxmeter and a temperature sensor combined, characterized in that it comprises:

providing a substrate of insulating matter, advantageously in the form of a flexible sheet, applying on one face of said substrate a first continuous thin layer made of the first conductive or semi-conductive matter mentioned above, advantageously in the form of a sheet, applying on the other face of said substrate, opposite said first layer, a second continuous thin layer made of the fifth conductive or semi-conductive matter mentioned above, advantageously also in the form of a sheet, posing determined masks on said first and second layers coating the substrate, advantageously defining lines of attack of the layers;

etching said layers by immersing the whole with the masks in an etching solution by the conventional engraving technique so as to etch the first and second layers along certain lines, thus defining in the first sheet the uninterrupted layer mentioned above and the first patterns mentioned above, and in the second sheet, the second patterns mentioned above, depositing by metallization the zones mentioned above made of a second conductive or semi-conductive matter on said uninterrupted thin layer, advantageously with the aid of masks, making the orifices and channels mentioned above, advantageously by chemical attack with masks;

and depositing by metallization metal coatings inside the orifices mentioned above, advantageously also with use of masks.

According to an advantageous feature of the process of the invention, a sheet of insulating matter is applied on the face comprising the zones mentioned above, and then a conductive or semi-conductive sheet, preferably identical to the second sheet mentioned above, made of the fifth conductive or semi-conductive matter.

BRIEF DESCRIPTION OF THE DRAWINGS

The invention will be more readily understood on reading the following description with reference to the accompanying drawings, in which:

FIG. 1 is a partially exploded view of the composite material according to the present invention, clearly showing the face comprising the fluxmeter and a part of the temperature sensor.

FIG. 2 is a plan view of this same face, over a large surface.

FIG. 2a is a view in detail showing the individual cells of the fluxmeter and a pattern of the temperature sensor, and FIG. 3 shows a view from underneath of the composite material in the direction of arrow III of FIG. 1.

DETAILED DESCRIPTION OF THE DRAWINGS

Referring now to the drawings, FIGS. 1 to show a composite material according to the invention, preferably flexible, represented by the general reference 1, which comprises:

a substrate 2 made of insulating matter, i.e. a matter non-conductive of electricity, such as for example a polyimide or an epoxy resin. This substrate may possibly be in the form of a sheet which presents the advantage of being flexible and of rendering the composite material flexible;

on one face, in the present case the upper face 2a, there is deposited an uninterrupted thin layer 3 made of a first conductive or semi-conductive matter;

this uninterrupted thin layer 3 is coated on at least its face 3a opposite the substrate 2 of insulating matter, with a succession of zones 4, separated from one another, and disposed in successive rows, as will be readily understood on studying FIGS. 1, 2 and 2a, constituted by very thin deposits of a second conductive or semi-conductive matter having a thermoelectric power different from that of the first conductive or semi-conductive matter.

This composite material is characterized according to the invention in that the insulating substrate 2 comprises on its face 2a comprising the uninterrupted thin layer 3 a certain number of free spaces 6 in at least certain of which are made a certain number of first metal patterns 8 which are clearly seen in FIG. 1, in a third conductive or semi-conductive matter, constituting a first arm of a thermocouple.

An equal number of second metal patterns 10, shown in broken lines in FIG. 1 and clearly visible in FIG. 3, made of a fourth conductive or semi-conductive matter having a thermoelectric power different from that of the corresponding third conductive or semi-conductive matter, constituting a second arm of a thermocouple, is disposed on face 2b of the insulating substrate 2 opposite the thin layer of the first pattern 8; each first pattern 8 is in electrical contact with a corresponding second pattern 10 by a metal spot weld 12 made in an orifice 14 traversing at least said first pattern 8 and the substrate 2 of insulating matter.

According to a particular embodiment, as shown, the uninterrupted thin layer 3 is in the form of a meandering strip and thus defines successive rows. In addition, according to a preferred embodiment shown, at least one channel 16 passes right through at least the majority of the zones and the subjacent thin layer 3, these channels 16 being offset with respect to the centre C of each zone traversed.

According to another advantageous feature, the said weld 12 of the first pattern 8 with the second pattern 10 is effected by metallization and preferably covers the first pattern 8 over a determined surface 15 around the orifice 14, which ensures a good mechanical connection of the weld 12 with the first pattern 8. Advantageously, the metal weld 12 is made of the same conductive material as the second conductive or semi-conductive matter mentioned above, constituting zones 4. According to another feature of the invention, the third conductive or semi-conductive matter mentioned above constituting the first patterns 8 and the first conductive or semi-conductive matter constituting the uninterrupted thin layer 3 are made of the same conductive or semi-conductive matter. According to another advantageous feature of the composite material according to the invention, the latter comprises a thin metal sheet 20 made of a fifth conductive or semi-conductive matter having a thermoelectric power different from that of the first conductive or semi-conductive matter, preferably being identical to the second conductive or semi-conductive matter. This sheet 20 is applied against the other face 2b of the substrate of insulating matter 2 opposite the face 2a comprising the uninterrupted layer 3 with the zones 4 mentioned above. This sheet 20 comprises spaces 22 for the second patterns 10 mentioned above.

The second patterns 10 are advantageously made of the same conductive or semi-conductive matter as the sheet 20. According to the embodiment preferred at present, as shown, a new sheet 24 of insulating matter, i.e. non-conductive of electricity or dielectric, is applied against the zones 4. This sheet 24 made of insulating matter is preferably itself covered on its opposite free face with a metal sheet 26 made of a sixth conductive or semi-conductive matter which is advantageously identical to the fifth conductive or semi-conductive matter, i.e. this sheet 26 is made of a conductive or semi-conductive matter identical to that of the sheet 20.

According to an even more preferred embodiment, the thin layer 3 and the first patterns 8 are made of Constantan, whilst the sheet 20 and the second patterns 10 are made of copper, and the substrate 2 of insulating matter and the sheet 24 of insulating matter may be made of a polyimide marketed under the Trademark Kapton ®.

It will be emphasized that the channels 16 of zones 4 are preferably offset in opposite direction between two successive or adjacent rows, as is clearly visible in FIG. 2a. This composite material may thus be used for constituting a measuring device forming a fluxmeter and a temperature sensor combined, in which the ends $E_1$ and $S_1$ of the uninterrupted thin layer 3 are connected together via an apparatus forming fluxmeter and measuring the electromotive force as a function of the thermal flux passing through the composite material 1, whilst the corresponding ends of the first patterns $M_1$ are connected to the ends of the second patterns $M_2$ by an apparatus forming temperature detector and measuring the electromotive force as a function of the temperature.

The process of preparing this composite material, preferably flexible, as described hereinabove in general and with reference to the preferred embodiment, with Constantan and copper as being the only two conductive or semi-conductive matters used, is as follows:

a substrate 2 of insulating matter, nonconductive of electricity, is provided, in the form of a flexible sheet;

a sheet of Constantan is applied on face 2a, and a sheet of copper on opposite face 2b;

determined masks are posed on each of the Constantan and copper sheets, for example formed by a protective layer of photosensitive resin inert with respect to an etching solution in accordance with the conventional engraving technique, as described on page 6, lines 5 to 33 in French Pat. No. 2 536 536;

the layers are etched by dipping the whole with the masks in said etching solution, which may for example be constituted by iron perchloride along certain lines, thus defining in the sheet of Constantan the uninterrupted layer 3 in the form of a meandering strip and the first patterns 8, and in the copper sheet, the second patterns 10;

zones 4 are then deposited by metallization, still by the same masking technique, by electrolysis, on the uninterrupted layer 3 in the form of a meandering strip;

the orifices 12 and channels 16 are made by chemical attack, according to the engraving technique, with the aid of appropriate masks, and a fresh deposit of copper is effected by metallization so as to form a metal coating inside the said orifices, so as to constitute junctions or electrical contacts forming thermocouples.

Finally, a sheet of insulating matter 24 is applied on the face 2a comprising zones 4 and then a conductive copper sheet 26, thus obtaining the composite material shown in exploded view in FIG. 1 and it is thus readily appreciated that all the unexpected determining technical advantages set forth hereinabove are obtained, in particular a simple design allowing easy manufacture by reliable and industrially efficient techniques such as those using the technique of engraving with masks.

What is claimed is:

1. In a composite material, comprising a substrate of insulating matter on one face of which is deposited an uninterrupted thin layer of a first conductive or semi-conductive matter coated on at least its face opposite said substrate of insulating matter by a succession of zones, separated from one another and disposed in successive rows, constituted by very thin deposits of a second conductive or semi-conductive matter having a different thermoelectric power from that of the first conductive or semi-conductive matter, said insulating substrate comprises on its face comprising said uninterrupted thin layer a certain number of free spaces in at least certain of which are made a certain number of first metal patterns of a third conductive or semi-conductive matter, constituting a first arm of a thermocouple, an equal number of second metal patterns of a fourth conductive or semi-conductive matter with a thermoelectric power different from that of said third matter, constituting a second arm of a thermocouple, is disposed on that face of the insulating substrate opposite the uninterrupted thin layer and said first patterns, each first pattern is in contact with a corresponding second pattern by a metallic spot weld made in an orifice passing through at least said first pattern and said substrate of insulating matter.

2. The composite material of claim 1, wherein said spot weld is effected by metallization and covers the first pattern over a determined surface around the orifice.

3. The composite material of claim 1, wherein the third conductive or semi-conductive matter constituting the first patterns and the first conductive or semi-conductive matter constituting the uninterrupted thin layer are made of the same conductive or semi-conductive matter.

4. The composite material of claim 1, wherein said spot weld is made of the same conductive or semi-conductive matter as the second conductive or semi-conductive matter constituting the zones mentioned above.

5. The composite material of claim 1, wherein it comprises a thin sheet of a fifth conductive or semi-conductive matter applied against the other face of the insulating substrate opposite the face comprising the uninterrupted thin layer with the said zones, comprising spaces for the second patterns mentioned above.

6. The composite material of claim 5, wherein the second patterns are made of the same conductive or semi-conductive matter as said thin sheet of a fifth conductive or semi-conductive matter.

7. The composite material of claim 5, wherein said uninterrupted thin layer and the first patterns are made of Constantan, and said thin sheet of a fifth conductive or semi-conductive matter and the second patterns are made of copper.

8. The composite material of claim 1, wherein it comprises a sheet of insulating matter, non-conductive of electricity, applied against the zones mentioned above.

9. The composite material of claim 1, wherein said uninterrupted thin layer has the shape of meandering strip and thus defines the said successive rows.

10. A measuring device forming a fluxmeter and a temperature sensor combined, wherein said device comprises a composite material as defined in any one of claims 1 to 9, in which the ends of the said uninterrupted thin layer are connected together via an apparatus forming fluxmeter and measuring the electromotive force as a function of the thermal flux passing through the composite material, while the ends of the first patterns are connected to the ends of the second patterns by an apparatus forming temperature detector and measuring the electromotive force as a function of the temperature.

11. A process for preparing a composite material, used as a measuring device forming a fluxmeter and a temperature sensor combined, the process comprising the steps of:

providing a substrate of insulating matter, applying on one face of said substrate a first continuous thin layer made of a first conductive or semi-conductive matter, applying on the other face of said substrate opposite the first layer, a second continuous thin layer made of a first conductive or semi-conductive matter, posing determined masks on said first and second layers coating the substrate, etching said layers by immersing the whole with the masks in an etching solution so as to etch the first and second layers along certain lines, thus defining in the first sheet the said uninterrupted layer and first patterns and in the second sheet, second patterns, depositing by metallization zones made of a second conductive or semi-conductive matter on said uninterrupted thin layer making orifices and channels, and depositing by metallization a metal coating inside the orifices.

12. The process of claim 11, wherein a sheet of insulating matter, non-conductive of electricity is applied on the face comprising the zones.

13. The process of claim 12, further comprising the step of applying a conductive sheet made of a sixth conductive or semi-conductive matter to said sheet of insulating matter applied on the face comprising the zones.

14. The process of claim 13, wherein said sixth conductive or semi-conductive matter is identical to said fifth conductive or semi-conductive matter.

15. The process of claim 13, wherein said sixth conductive or semi-conductive matter is comprised of copper.

16. The composite material of claim 8, wherein said sheet of insulating matter applied against the zones is coated with a sheet of a sixth-conductive or semi-conductive matter.

17. The composite material of claim 16, wherein said sixth conductive or semi-conductive matter is identical to said fifth conductive or semi-conductive matter.

18. The composite material of claim 16 wherein said sixth conductive or semi-conductive matter is comprised of copper.

19. The composite material of claim 9, wherein at least one channel passes through at least the majority of the zones and the subjacent thin layer, said at least one channel being offset with respect to the center of each zone traversed.

* * * * *

UNITED STATES PATENT AND TRADEMARK OFFICE
CERTIFICATE OF CORRECTION

PATENT NO. : 4,817,436
DATED : April 4, 1989
INVENTOR(S) : Hébert Sallée et al.

It is certified that error appears in the above-identified patent and that said Letters Patent is hereby corrected as shown below:

Column 5, line 9, "FIGS. 1 to show" should read --FIGS. 1 to 3 show--.

Column 5, line 56, "zones and" should read --zones 4 and--.

Column 8, line 40, "first conductive" should read --fifth conductive--.

Signed and Sealed this

Eleventh Day of December, 1990

Attest:

HARRY F. MANBECK, JR.

*Attesting Officer*     *Commissioner of Patents and Trademarks*